(12) United States Patent
Bemmerl et al.

(10) Patent No.: US 10,971,457 B2
(45) Date of Patent: Apr. 6, 2021

(54) SEMICONDUCTOR DEVICE COMPRISING A COMPOSITE MATERIAL CLIP

(71) Applicant: Infineon Technologies AG, Neubiberg (DE)

(72) Inventors: Thomas Bemmerl, Schwandorf (DE); Martin Gruber, Schwandorf (DE); Thorsten Scharf, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/382,866

(22) Filed: Apr. 12, 2019

(65) Prior Publication Data

US 2019/0333874 A1    Oct. 31, 2019

(30) Foreign Application Priority Data

Apr. 26, 2018  (DE) ...................... 10 2018 206 482.2

(51) Int. Cl.
*H01L 23/00*  (2006.01)
*H01L 23/495*  (2006.01)
*H01L 21/48*  (2006.01)

(52) U.S. Cl.
CPC ........ *H01L 23/564* (2013.01); *H01L 21/4825* (2013.01); *H01L 23/49513* (2013.01); *H01L 23/49524* (2013.01); *H01L 23/49562* (2013.01); *H01L 23/49568* (2013.01); *H01L 23/49575* (2013.01); *H01L 24/37* (2013.01); *H01L 24/40* (2013.01); *H01L 24/84* (2013.01);
(Continued)

(58) Field of Classification Search
CPC ......... H01L 2924/00014; H01L 23/564; H01L 2224/84205; H01L 23/49524; H01L 23/49562; H01L 23/49568; H01L 23/49575; H01L 24/37; H01L 24/40; H01L 24/84; H01L 21/4825; H01L 2224/37032; H01L 2224/37147; H01L 2224/37124; H01L 2224/40245; H01L 23/49513; H01L 23/49537; H01L 23/49551; H01L 23/49517; H01L 24/73; H01L 23/3107
See application file for complete search history.

(56) References Cited

U.S. PATENT DOCUMENTS 4,355,082 A   10/1982  Bischoff et al.
5,245,215 A    9/1993  Sawaya
(Continued)

FOREIGN PATENT DOCUMENTS

DE   30 23 528   1/1982
DE   41 30 637   4/1992
(Continued)

*Primary Examiner* — Jasmine J Clark
(74) *Attorney, Agent, or Firm* — Dicke, Billig & Czaja, PLLC (57) ABSTRACT

A semiconductor device is disclosed. In one example, the semiconductor device comprises a first semiconductor die comprising a first surface, a second surface opposite to the first surface, and a contact pad disposed on the first surface, a further contact pad spaced apart from the semiconductor die, a clip comprising a first layer of a first metallic material and a second layer of a second metallic material different from the first metallic material, wherein the first layer of the clip is connected with the contact pad, and the second layer of the clip is connected with the further contact pad.

20 Claims, 7 Drawing Sheets

(52) U.S. Cl.
    CPC ............... *H01L 2224/37032* (2013.01); *H01L 2224/37124* (2013.01); *H01L 2224/37147* (2013.01); *H01L 2224/40245* (2013.01); *H01L 2224/84205* (2013.01)

(56) References Cited

U.S. PATENT DOCUMENTS

| | | |
|---|---|---|
| 7,589,413 B2 | 9/2009 | Otremba et al. |
| 8,013,441 B2 | 9/2011 | Bauer et al. |
| 8,022,558 B2 | 9/2011 | Law et al. |
| 8,410,590 B2 | 4/2013 | Otremba |
| 8,823,175 B2 | 9/2014 | Bayerer |
| 8,975,117 B2 * | 3/2015 | Otremba ................. H01L 24/37 438/118 |
| 10,214,652 B2 | 2/2019 | Dreissigacker et al. |
| 2008/0145607 A1 | 6/2008 | Kajiwara et al. |
| 2009/0057855 A1 | 3/2009 | Quinones et al. |
| 2009/0224383 A1 | 9/2009 | Cruz et al. |

FOREIGN PATENT DOCUMENTS

| | | |
|---|---|---|
| DE | 10 2005 049 687 | 4/2007 |
| DE | 10 2005 061 015 | 6/2007 |
| DE | 10 2009 042 320 | 7/2010 |
| DE | 10 2010 000 407 | 8/2010 |
| DE | 10 2013 208 818 | 11/2013 |
| DE | 10 2015 101 527 | 8/2016 |
| EP | 0498446 | 8/1992 |
| WO | 2012/053129 | 4/2012 |

\* cited by examiner

SEMICONDUCTOR DEVICE COMPRISING A COMPOSITE MATERIAL CLIP

CROSS-REFERENCE TO RELATED APPLICATION

This Utility Patent Application claims priority to German Patent Application No. 10 2018 206 482.2, filed Apr. 26, 2018, which is incorporated herein by reference.

TECHNICAL FIELD

The present disclosure relates to a semiconductor device and to a process for connecting a clip to two different contact pads.

BACKGROUND

An important aspect in the manufacturing of semiconductor devices is related to the fabrication of interconnections, in particular interconnections between different semiconductor dies or between semiconductor dies and external leads. In this respect clips or bonding wires are usually employed as intermediate connection elements. These intermediate connection elements are configured to establish an electrical connection between e.g. a contact pad of a semiconductor die and an external lead or between contact pads of different semiconductor dies. In order to fulfill this purpose firm and stable connection links have to be fabricated at both sides of the interconnection.

To this end, a problem may arise from the fact that e.g. a clip which is intended to be used as an intermediate connection element is comprised of a material which may be different from a material of a contact pad of a semiconductor die or different from a material of an external lead or different from a material of a contact pad of a further semiconductor die. Moreover, often an implementation of a soldering process appears to be necessary for fabricating the connection, but it turns out that a metallization layer of a particular contact pad is not solderable. Above the solving of all these problems, there is always the requirement to provide an easy and cost-effective fabrication method.

The above described problems become even more important in case of power semiconductor devices, e.g. power semiconductor transistor devices, due to high electric currents flowing through these devices and the resulting high power dissipation and thermal load on all device components and areas involved.

SUMMARY

A first aspect of the present disclosure relates to a semiconductor device. The semiconductor device comprises a first semiconductor die comprising a first surface, a second surface opposite to the first surface, and a contact pad disposed on the first surface, a further contact pad spaced apart from the semiconductor die, a clip comprising a first layer of a first metallic material and a second layer of a second metallic material different from the first metallic material, wherein the first layer of the clip is connected with the contact pad, and the second layer of the clip is connected with the further contact pad.

A clip of the above described configuration can be called composite material clip and it is capable of being connected to different surface materials resulting in stable and easy-to-fabricate interconnections. In particular, such a composite material clip allows to realize interconnection solutions in which there is no need for solderable contact pads of semiconductor dies or front side metallizations of semiconductor dies. The composite material clip can, for example, be employed in a semiconductor device for connecting a first contact pad with an external lead. Furthermore, the composite material clip can be employed in system of package products which, for example, contain two or more semiconductor dies having different semiconductor die front side metallizations. These and other possible applications will be outlined in more detail further below.

According to an embodiment of the semiconductor device of the first aspect, the first and second layers of the clip are connected with each other, in particular positively or directly connected with each other. According to an embodiment thereof, the first and second layers each comprise the shape of an elongated strip, wherein both elongated strips are connected with each other along their respective longitudinal surfaces. Each one of the elongated strips comprises a thickness being defined as an extension between a first longitudinal surface to a second opposite longitudinal surface. The thicknesses of the elongated strips of the first and second layers can be equal or different to each other.

According to an embodiment of the semiconductor device according to the first aspect, the further contact is an external lead. According to a further embodiment thereof, the clip comprises a horizontal portion and a bent portion, wherein the horizontal portion is disposed at least in part above the semiconductor die, and wherein the bent portion is disposed at least in part above the external lead. In particular, the bent portion may be formed in such a way that the bending angle can be in a range between 90° and 180°. In case of a clip having a shape as described above, comprising two elongated connected strips, a spatial configuration results in which in the horizontal portion the first layer of the clip is facing the contact pad and in the bent portion the second layer is facing the lead. According to an embodiment of the semiconductor device of the first aspect, the semiconductor device further comprises a die pad, wherein the semiconductor die is attached with its second surface to the die pad. According to a further embodiment thereof, the external lead and the die pad are disposed in one and the same plane or in different planes. According to a further embodiment thereof, the external lead and the die pad are part of one and the same leadframe.

According to an embodiment of the semiconductor device of the first aspect, a material of the contact pad is similar or identical to the first metallic material, and/or a material of the further contact pad is similar or identical to the second metallic material. For example, in case of the further contact pad being an external lead, the external lead can be made of Cu and also the second layer of the clip can be made of Cu, and the contact pad of the semiconductor die can be made of Al and also the second layer of the clip can be made of Al.

According to an embodiment of the semiconductor device according to the first aspect, the semiconductor device further comprises a second semiconductor die comprising a first surface and a second surface opposite to the first surface, wherein the further contact pad is a contact pad disposed on the second surface of the second semiconductor die. According to a further embodiment thereof, the first layer of the clip comprises an opening disposed above the further contact pad of the second semiconductor die, wherein the second layer of the clip extends into the opening in order to make contact with the further contact pad of the second semiconductor die. According to a further embodiment thereof, the semiconductor device comprises a second die pad, wherein the second semiconductor die is attached with the second surface to the second die pad. According to a further embodiment thereof, the first and second die pad can be disposed in one and the same plane or in different planes and/or can be part of one and the same leadframe.

According to an embodiment of the semiconductor device according to the first aspect, one or more of the first and second layers of the clip can be configured as a continuous or contiguous layer or one or more of them can be configured as a structured layer or as a layer having one or more openings formed therein.

A second aspect of the present disclosure also relates to a semiconductor device. The semiconductor device according to the second aspect comprises a first surface, a second surface opposite to the first surface, and a contact pad disposed on the first surface, a clip comprising a first layer of a first metallic material and a second layer of a second material different from the first metallic material, wherein the first layer of the clip is connected with the contact pad, and the second layer of the clip is exposed to the outside.

According to an embodiment of the semiconductor device according to the second aspect, the semiconductor device further comprises a die pad, wherein the semiconductor die is attached with its second surface to the die pad.

According to an embodiment of the semiconductor device of the second aspect, the semiconductor device further comprises an external lead, wherein the first metallic layer of the clip is connected with the external lead. According to a further example thereof, the external lead and the die pad are disposed in one and the same plane and/or the external lead and the die pad are part of one and the same leadframe.

The semiconductor device according to the second aspect offers the possibility to implement dual side cooling. More specifically, the die pad can be exposed to the outside at a lower main surface of the semiconductor device, and the second layer of the clip can be exposed to the outside at an upper main surface of the semiconductor device, the upper main face being opposite to the lower main face. At both the upper and lower main faces of the semiconductor device heat sinks can be attached so that excessive heat produced by the semiconductor die can be dissipated through both opposing sides of the semiconductor device. In such an embodiment the second layer of the clip may comprise a high thermal conductivity, in particular be comprised of a metallic material.

According to an embodiment of the semiconductor device of the second aspect, the second layer of the clip comprises a metallic material, in particular Al. This has the advantage that Al is known to be robust against corrosion so that the exposed Al layer could be used to protect the semiconductor device against external influences.

According to an embodiment of the semiconductor device of the second aspect, the first layer of the clip comprises a metallic material, in particular Cu.

According to an embodiment of the semiconductor device of the second aspect, the second layer of the clip comprises a non-metallic material, wherein the non-metallic material can be selected so that it fulfills optimum properties as regards resistivity against oxidation and/or corrosion and/or other external influences.

Further embodiments of the semiconductor device of the second aspect can be formed in accordance with embodiments of the first aspect or by adding one or more features as described in embodiments described further below.

A third aspect of the present disclosure relates to a process for connecting a clip to two different contact pads, the process comprising providing a clip comprising a first metallic layer of a first metallic material and a second metallic layer of a second metallic material different from the first metallic material, connecting the first metallic layer to a first contact pad by a first connecting process, and connecting the second metallic layer to a second contact pad by a second connecting process.

According to an embodiment of the process of the third aspect, the process is conducted in such a way that either one of a semiconductor device according to the first or second aspects is fabricated.

According to an embodiment of the process of the third aspect, the first metallic material is Cu, and the second metallic material is Al.

According to an embodiment of the process of the third aspect, the second connecting process is similar or equal to the first connecting process. According to a further embodiment thereof, the first and second connecting processes both comprise ultrasonic welding.

According to an embodiment of the process of the third aspect, the second connecting process is different from the first connecting process.

Further embodiments of the process of the third aspect can be formed in accordance with embodiments of a semiconductor device of the first or second aspect or by adding one or more features as described in embodiments of a semiconductor device described further below.

A fourth aspect of the present disclosure relates to a composite material clip comprising a first layer of a first metallic material and a second layer of a second material different from the first metallic material, wherein the clip comprises a first horizontal portion and a second bent portion wherein the second bent portion is bent by an angle of at least 90° with respect to the first horizontal portion.

According to an embodiment of the composite material clip of the fourth aspect, the second bent portion is bent by an angle in a range between 90° and 180° with respect to the first horizontal portion.

According to an embodiment of the composite material clip of the fourth aspect, the first metallic material is Cu and the second material is a metallic material, in particular Al.

According to an embodiment of the composite material clip of the fourth aspect, the second material is a non-metallic material or non-conductive material. In particular, the second material can be a corrosion or oxidation resistant material.

According to an embodiment of the composite material clip of the fourth aspect, the clip is fabricated by a rolling process, which is a metal forming process in which a metal is passed through one or more pairs of rolls to reduce the thickness and to make the thickness uniform. For producing a clip according to the fourth aspect, the two different metals or materials are supplied to the rolls. Later on further forming or shaping steps can be performed with the clip in order to generate bent portions or lowered sections and so on.

Further embodiments of the composite material clip of the fourth aspect can be formed in accordance with embodiments of a semiconductor device of the first or second aspects or by adding one or more features as described in embodiments described further below.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the FIG. 1 comprises FIGS. 1A and 1B and shows an example of a semiconductor device according to the first aspect in a longitudinal sectional view along the length of the clip (A) and in a cross-sectional view (B), wherein in this example the second layer of the clip is connected with an external lead.

FIG. 2 comprises FIGS. 2A and 2B and shows an example of a composite material clip in a perspective view (A) and in a cross-sectional side view (B), in which example the clip comprises a horizontal portion and a bent portion, wherein the bent portion is bent by an angle of 90° with respect to the horizontal portion.

FIG. 3 comprises FIGS. 3A and 3B and shows an example of a composite material clip in a first perspective view (A) and a second perspective view (B), in which example the clip comprises a horizontal portion and a bent portion, wherein the bent portion is bent by an angle of 180° with respect to the horizontal portion.

FIG. 4 comprises FIGS. 4A and 4B and shows an example of a composite material clip in a first perspective view (A) and a second perspective view (B), in which example the clip comprises a horizontal portion and a bent portion, wherein the bent portion is bent by an angle of 180° with respect to the horizontal portion and wherein the second layer of the clip comprises through-holes for the application of ultrasonic radiation for ultrasonic welding.

FIG. 5 comprises FIG. 5A to 5C and shows an example of a semiconductor device according to the first aspect in a longitudinal sectional view along the length of the clip (A), in a first cross-sectional view through the semiconductor device in a plane of the first semiconductor die (B), and in a second cross-sectional view through the semiconductor device in a plane of the second semiconductor die (C), in which example the semiconductor device comprises two semiconductor dies, wherein the first layer of the clip is connected with the first semiconductor die and the second layer of the clip is connected with the second semiconductor die.

FIG. 6 comprises FIGS. 6A and 6B and shows an example of a semiconductor device according to the second aspect in a longitudinal sectional view along the length of the clip (A) and a cross-sectional view through the semiconductor device in a plane of the semiconductor die (B), in which example the second layer of the clip is exposed to the outside.

DETAILED DESCRIPTION OF THE DRAWINGS

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1A:
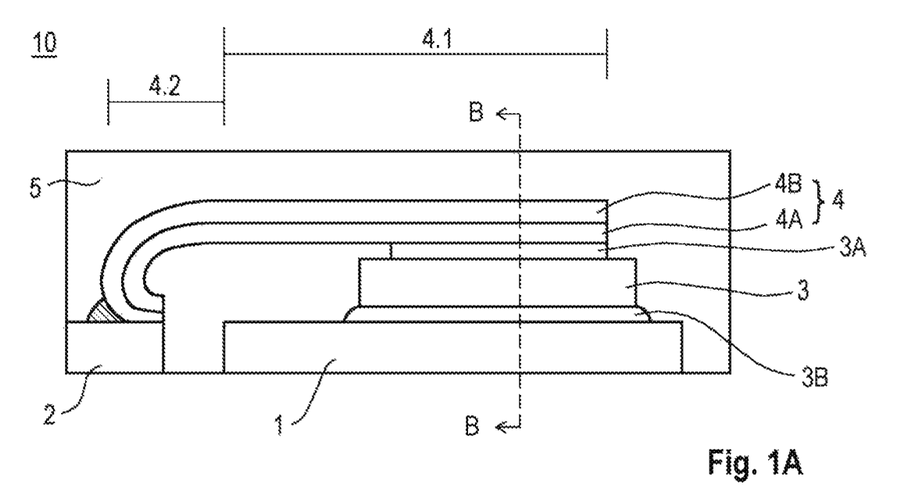
Figure 1B:
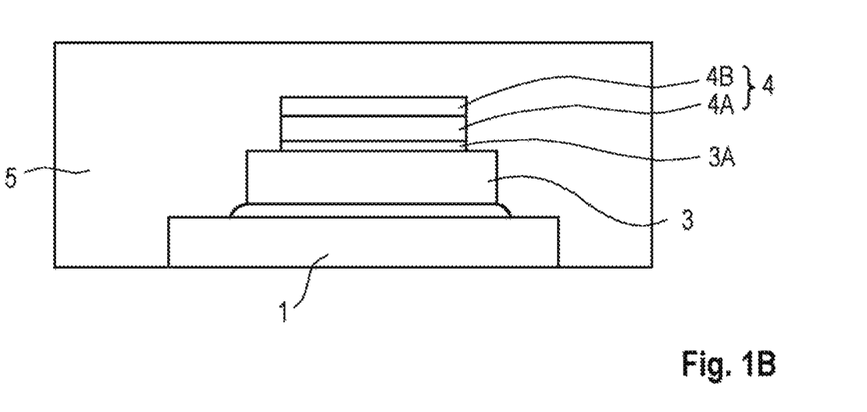

FIG. 1 includes FIGS. 1A and 1B and shows an example of a semiconductor device according to the first aspect. The semiconductor device 10 of FIG. 1 comprises a semiconductor die 3 comprising a first surface, a second surface opposite to the first surface, and a contact pad 3A disposed on the first surface, and an external lead 2 spaced apart from the semiconductor die 3. The semiconductor device 10 further comprises a clip 4 comprising a first layer 4A of a first metallic material and a second layer 4B of a second metallic material different from the first metallic material. The first layer 4A of the clip 4 is connected with the contact pad 3A and the second layer 4B of the clip 4 is connected with the external lead 2.

The semiconductor device 10 may further comprise a die pad 1, wherein the semiconductor die 3 can be attached with its second surface to the die pad 1. It can further be the case, such as shown in FIG. 1, that the external lead 2 and the die pad 1 are disposed in one and the same plane and in addition or alternatively that the external lead 2 and the die pad 1 are part of one and the same leadframe.

The semiconductor 10 of FIG. 1 may further comprise an encapsulant 5 which encapsulates the semiconductor die 3, the die pad 1, the external lead 2 and the clip 4 as shown in FIG. 1 in such a way that the external lead 2 and the die pad 1 are exposed to the outside with their respective lower surfaces.

A material of the contact pad 3A can be similar or identical to the first metallic material, and/or a material of the external lead 2 can be similar or identical to the second metallic material. In particular, it can be the case that the material of the contact pad 3A is Al and the first metallic material of the first layer 4A of the clip 4 is also Al. Furthermore, the material of the external lead 2 can be Cu and the second metallic material of the second layer 4B of the clip 4 can also be Cu.

As can be seen in FIG. 1A, the clip 4 may comprise a horizontal portion 4.1 and a bent portion 4.2, wherein the horizontal portion 4.1 is disposed at least in part above the semiconductor die 3, and wherein the bent portion 4.2 is disposed at least in part above the external lead 2. In the bent portion 4.2 the clip 4 is bent back by an angle of 180° so that the second layer 4B faces the external lead 2 and the first layer 4A does not face the external lead 2.

The semiconductor die 3 may comprise contact pads on both the first surface and the second surface. In particular, the semiconductor die 3 may comprise a vertical transistor (or diode) structure as, for example, an insulated gate bipolar transistor (IGBT) comprising a source contact pad 3A disposed on the first surface and a drain contact pad (not shown) disposed on the second surface, wherein the drain contact pad is electrically connected to the die pad 1 via solder layer 3B.

Figure 2A:
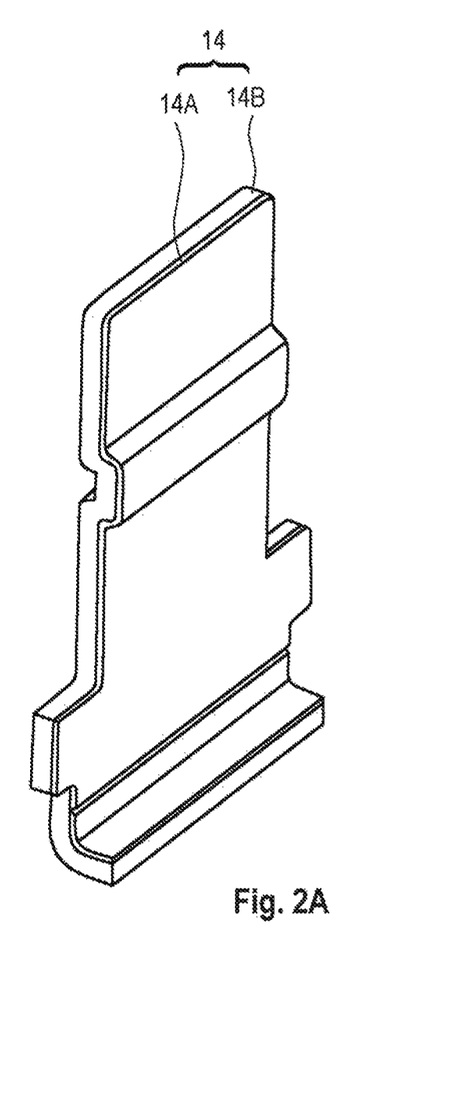
Figure 2B:
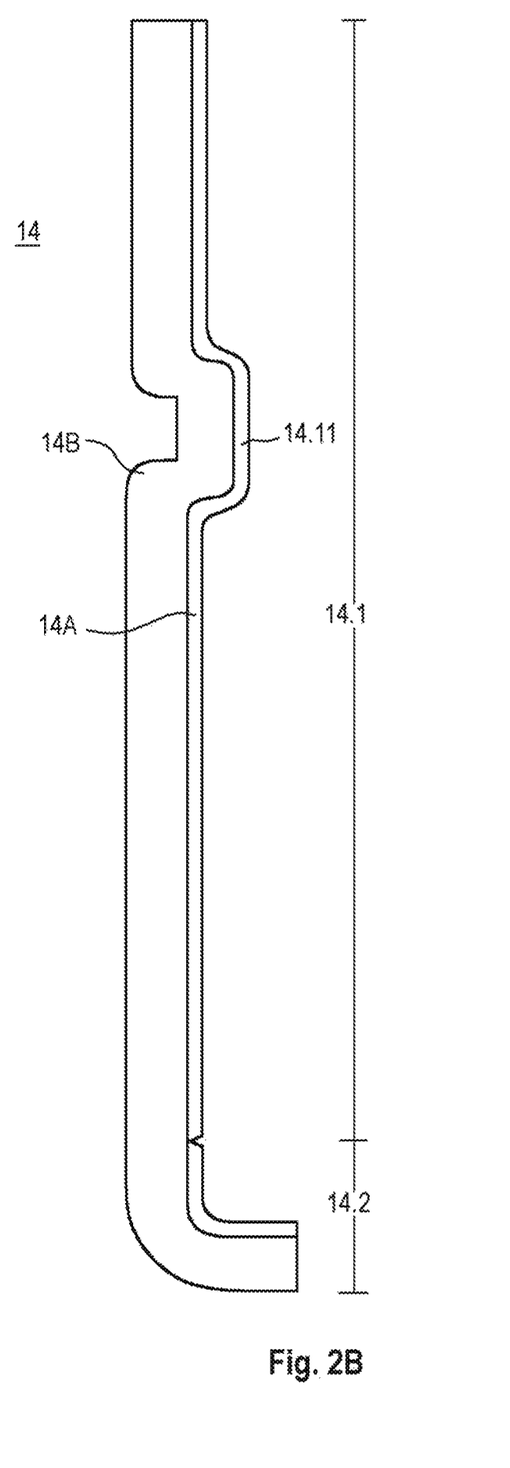

FIG. 2 comprises FIGS. 2A and 2B and shows an example of a composite material clip according to the fourth aspect. The clip 14, as shown in FIG. 2, comprises a first lower layer 14A of a first material and a second upper layer 14B of a second material. The first layer 14A may comprise Al and the second layer 14B may comprise Cu. The clip 14 of FIG. 2 further comprises an essentially horizontal portion 14.1 and a bent portion 14.2. The bent portion 14.2 is bent downwards by an angle of 90° with respect to the horizontal portion 14.1. The clip 14 is thus shaped in a way that the first layer 14A can be connected in the horizontal portion 14.1 with a contact pad of a semiconductor die and the lower end of the bent portion 14.2 can be connected with an external lead, wherein the contact pad of the semiconductor die and the external lead can be made of different materials. As shown in the example of FIG. 2, the horizontal portion 14.1 may further comprise a lowered section 14.11, the size and dimensions of which may correspond essentially with the size and dimensions of the contact pad of the semiconductor die.

Figure 3A:
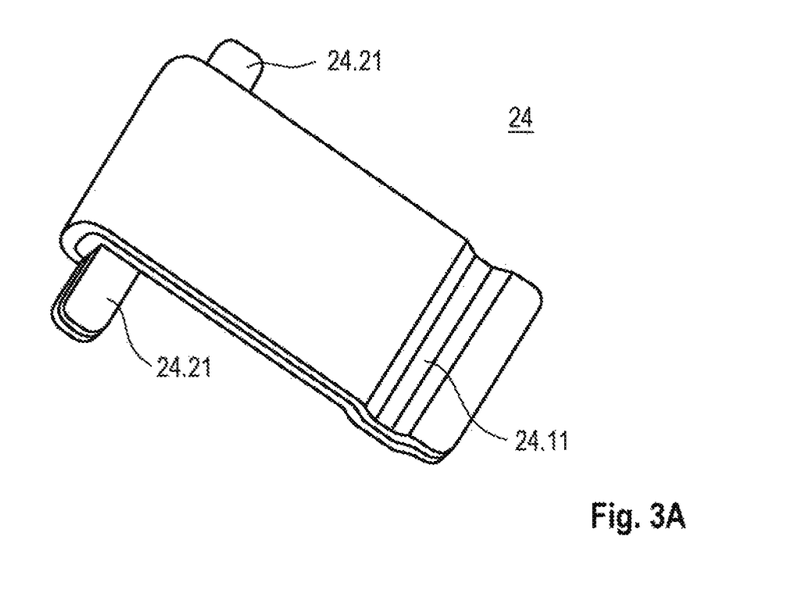
Figure 3B:
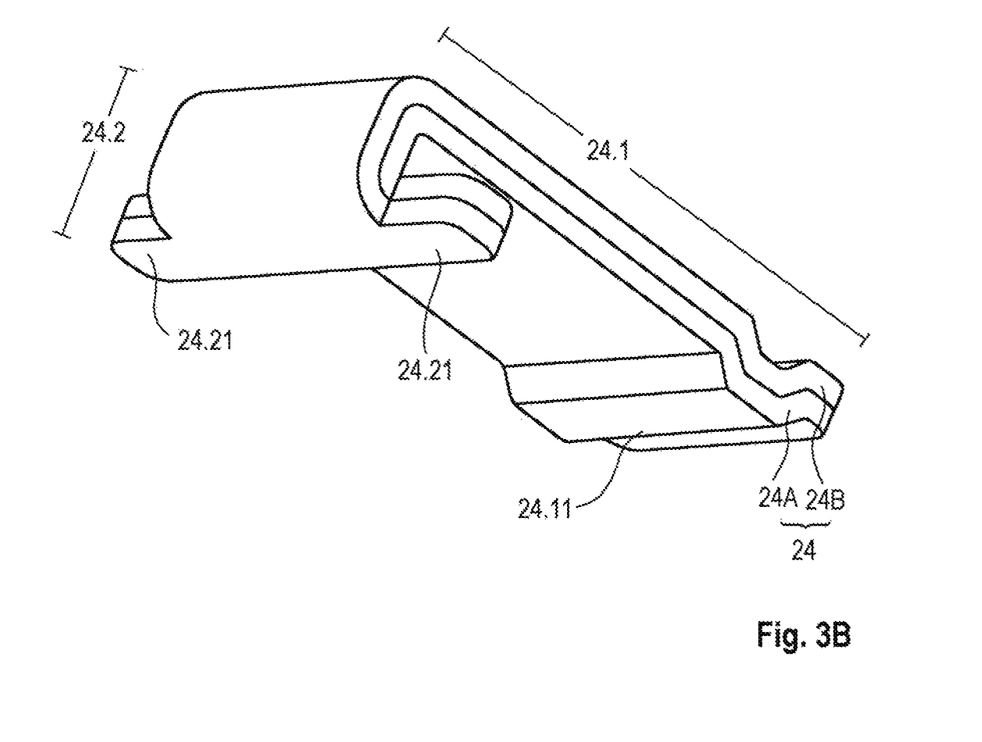

FIG. 3 comprises FIGS. 3A and 3B and shows an example of a composite material clip according to the fourth aspect. The clip 24 of FIG. 3 comprises a first lower layer 24A and a second upper layer 24B which layers can be made of different materials. The clip 24 further comprises an essentially horizontal portion 24.1 and a bent portion 24.2. The bent portion 24.2 is bent back with an angle of 180° with respect to the horizontal portion 24.1. Furthermore, the bent portion 24.2 comprises a lower end portion 24.21 having lateral extensions. The horizontal portion 24.1 comprises a lowered section 24.11 intended to be contacted with, for example, a contact pad of a semiconductor die.

Figure 4A:
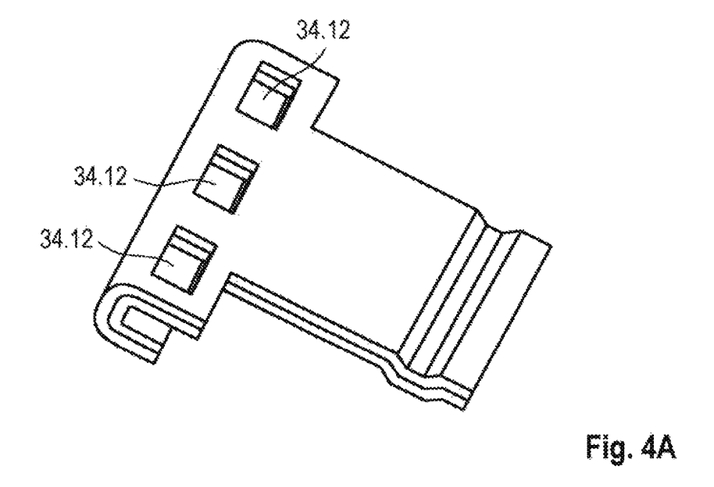
Figure 4B:
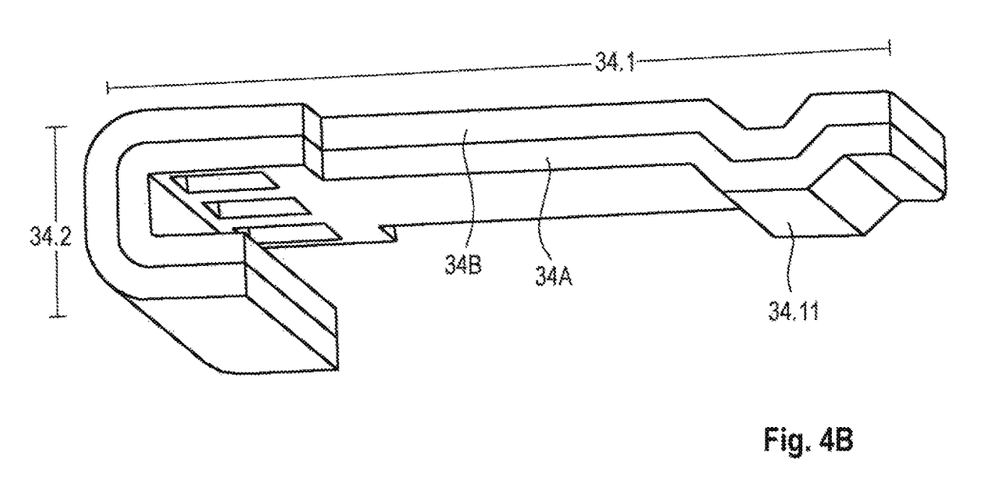

FIG. 4 comprises FIGS. 4A and 4B and shows an example of a clip according to the fourth aspect. The clip 34, as shown in FIG. 4, comprises a first lower layer 34A and a second upper layer 34B, wherein the layers can be made of different materials. The clip 34 further comprises an essentially horizontal portion 34.1 and a bent portion 34.2, wherein the bent portion 34.2 is bent by an angle of 180° with respect to the horizontal portion 34.1. The horizontal portion 34.1 further comprises a lowered section 34.11 which is intended to make contact with a contact pad or a semiconductor die. The clip 34 further comprises through-holes 34.12 in an area of the horizontal portion 34.1 adjacent to the bent portion 34.2. The through-holes 34.12 extend through the first and second layers 34A and 34B of the clip 34 and define the area for ultrasonic welding of the clip 34 onto a chip carrier.

Figure 5A:
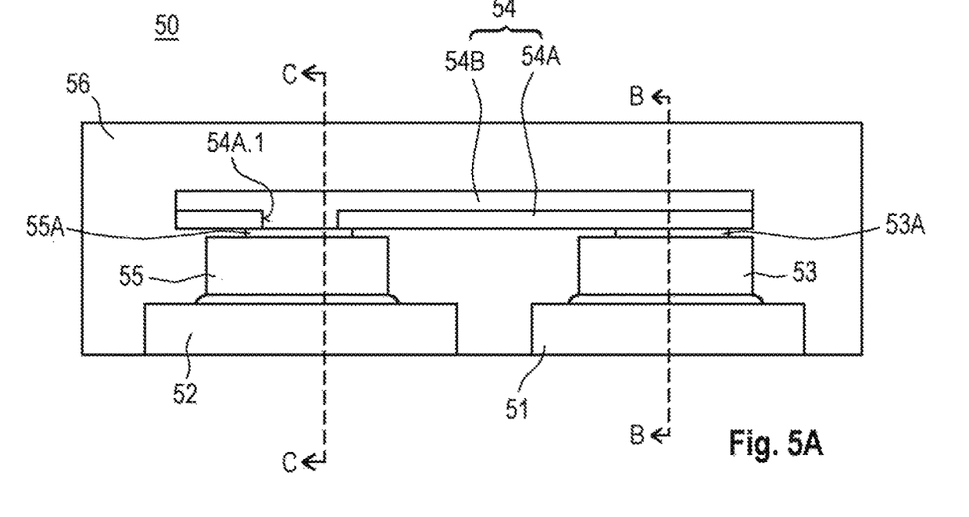
Figure 5B:
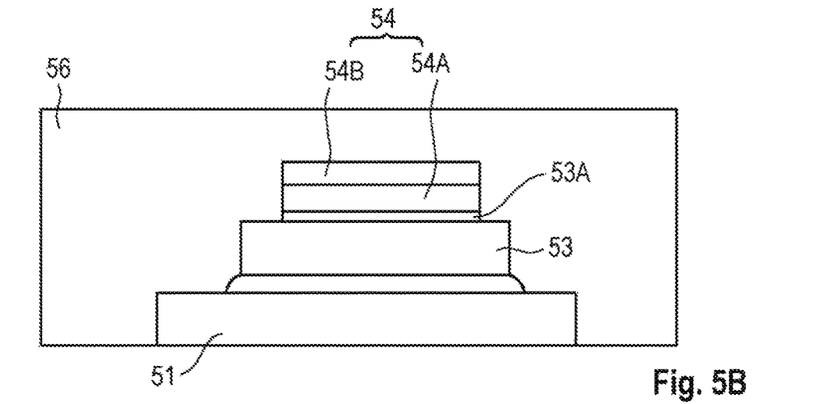
Figure 5C:
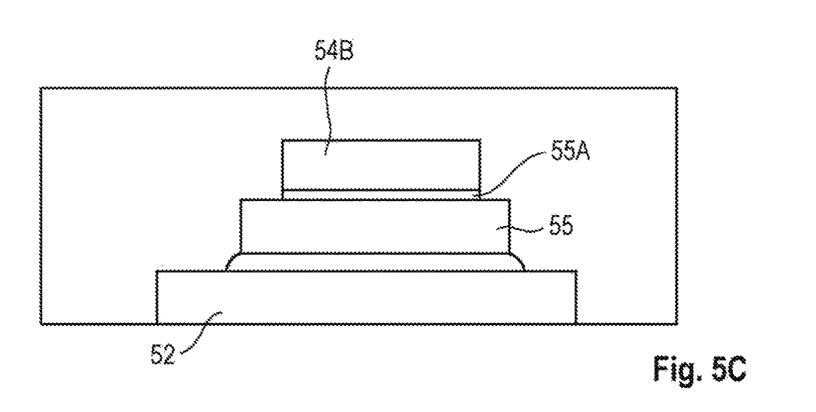

FIG. 5 comprises FIG. 5A to 5C and shows an example of a semiconductor device according to the first aspect. The semiconductor device 50 of FIG. 5 comprises a first semiconductor die 53 comprising a first surface, a second surface opposite to the first surface, and a contact pad 53A disposed on the first surface. The semiconductor device 50 further comprises a second semiconductor die 55 comprising a first surface and a second surface opposite to the first surface and a contact pad 55A disposed on the first surface of the second semiconductor die 55. The semiconductor device 50 further comprises a clip 54 comprising a first layer 54A of a first metallic material and a second layer 54B of a second metallic material different from the first metallic material. The first layer 54A of the clip 54 is connected with the contact pad 53A of the first semiconductor die 53, and the second layer 54B of the clip 54 is connected with the contact pad 55A of the second semiconductor die 55.

As shown in FIG. 5A, the first layer 54A of the clip 54 may comprise an opening 54A.1 disposed above the contact pad 55A of the second semiconductor die, wherein the second layer 54B extends into the opening 54A.1 in order to make contact with the contact pad 55A. The opening 54A.1 may have essentially the same size and dimensions as the contact pad 55A.

The semiconductor device 50 may further comprise a second die pad 52, wherein the second semiconductor die 55 can be attached with its second surface to the second die pad 52.

The semiconductor device 50 may as well as the first semiconductor die 53 comprise a vertical structure and may as well comprise a vertical transistor or a vertical diode structure.

The semiconductor device 50 may further comprise an encapsulant 56 which may encapsulate the first and second semiconductor dies 53 and 55, the first and second die pads 51 and 52, and the clip 54, for example, in such a way that only the first and second die pads 51 and 52 are exposed to the outside at a lower surface of the semiconductor device 50.

Figure 6A:
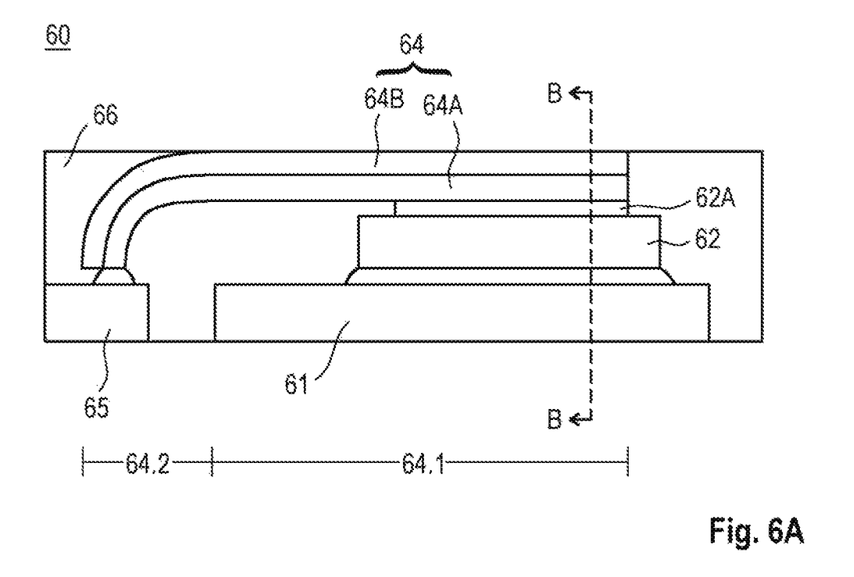
Figure 6B:
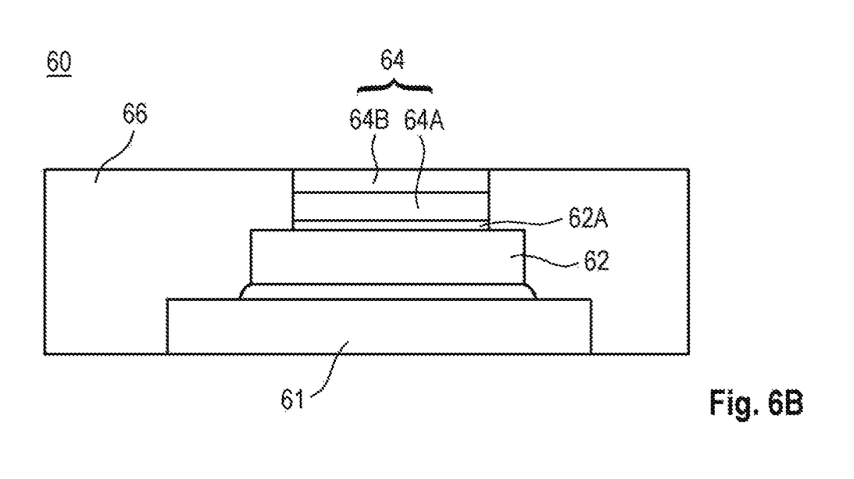

FIG. 6 comprises FIGS. 6A and 6B and shows an example of a semiconductor device according to the second aspect. The semiconductor device 60 of FIG. 6 comprises a semiconductor die 62 comprising a first surface, a second surface opposite to the first surface, and a contact pad 62A disposed on the first surface. The semiconductor device 60 further comprises a clip 64 comprising a first metallic layer 64A and a second layer 64B, wherein the first metallic layer 64A of the clip 64 is connected with the contact pad, and the second layer 64B of the clip 64 is exposed to the outside.

The semiconductor device 60 may further comprise a die pad 61, wherein the semiconductor die 62 may be attached with its second surface to the die pad 61.

The semiconductor device 60 may further comprise an external lead 65, wherein the first metallic layer 64A of the clip 64 may be connected with the external lead 65. The external lead 65 and the die pad 61 may be disposed in one and the same plane and/or may be part of one and the same leadframe.

The semiconductor device 60 may further comprise an encapsulant 66 which may encapsulate the semiconductor die 62, the die pad 61, the clip 64, and the lead 65 in such a way that the clip 64 is exposed to the outside at an upper surface of the semiconductor device 60 and the die pad 61 and the lead 65 are exposed to the outside at a lower surface of the semiconductor device 60. Such a configuration allows double-side cooling of the semiconductor device 60 by applying respective heat sinks to the upper and lower surfaces of the semiconductor device 60.

The clip 64 may comprise an essentially horizontal portion 64.1 and a bent portion 64.2, wherein the bent portion 64.2 is bent downwards by an angle in a range between 70° and 90° with respect to the horizontal portion 64.1, wherein a lower end of the first layer 64A is connected to the external lead 65, e.g. by means of an intermediate solder layer.

The first lower layer 64A of the clip 64 may comprise or be made of Cu, and the second upper layer 64B of the clip 64 may comprise or be made of Al. Al is known to be robust against corrosion so that the second layer 64B may also serve as an ideal passivation or anti-corrosion or anti-oxidation protection layer at the upper surface of the semiconductor device 60. The second layer 64B of the clip 64 can also be made of a non-conductive material and can, moreover, be selected according to optimum anti-corrosion or anti-oxidation properties.

Figure 7:
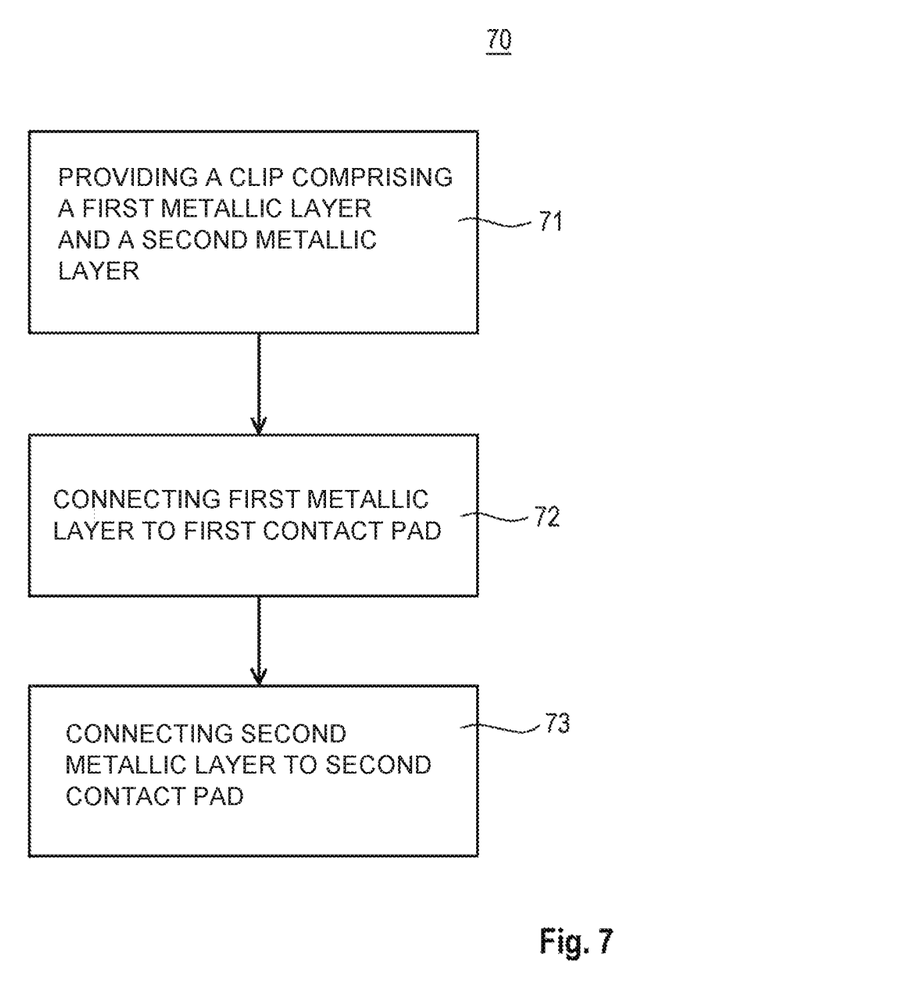
FIG. 7 shows a flow diagram of an example of a process for connecting a clip to two different contact pads according to the third aspect.

FIG. 7 shows a flow diagram for illustrating a process for connecting a clip to two different contact pads.

The process 70, as depicted in FIG. 7, comprises providing a clip comprising a first metallic layer and a second metallic layer (71), wherein the clip and the first and second metallic layers thereof may include any features or properties which were described above in connection with the semiconductor device according to the first and second aspect or the clip according to the fourth aspect.

The process 70 of FIG. 7 further comprises connecting the first metallic layer to a first contact pad by a first connecting process (72), and connecting the second metallic layer to a second contact pad by a second connecting process (73). The second contact pad can be either an external lead or a contact pad of a semiconductor die.

The first and second connecting processes can be either similar or equal or they can be different from each other. In the first case, for example, the first and second connecting processes may each comprise ultrasonic welding. In the second case, for example, one of the first and second connecting processes can be ultrasonic welding and the other one can be another connecting process like, for example, soldering.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features. The articles "a", "an" and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

Although the disclosure has been shown and described with respect to one or more implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising
    a first semiconductor die comprising a first surface, a second surface opposite to the first surface, and a contact pad disposed on the first surface;
    a further contact pad spaced apart from the semiconductor die;
    a clip comprising a first layer of a first metallic material and a second layer of a second metallic material different from the first metallic material; wherein
    the first layer of the clip is connected with the contact pad, and the second layer of the clip is connected with the further contact pad.

2. The semiconductor device according to claim 1, further comprising
    a first die pad; wherein
    the first semiconductor die is attached with its second surface to the first die pad.

3. The semiconductor device according to claim 1, wherein
    one or more of
    a material of the contact pad is similar or identical to the first metallic material; and
    a material of the further contact pad is similar or identical to the second metallic material.

4. The semiconductor device according to claim 1, wherein
    one of the first and second metallic material is Cu and the other one is Al.

5. The semiconductor device according to claim 1, wherein
    the further contact pad is an external lead.

6. The semiconductor device according to claim 5, wherein
    the clip comprises a horizontal portion and a bent portion, wherein the horizontal portion is disposed at least in part above the semiconductor die, and wherein
    the bent portion is disposed at least in part above the external lead.

7. The semiconductor device according to claim 2, wherein the further contact pad is an external lead, and wherein a lower surface of the external lead and a lower surface of the die pad both lie in a same plane.

8. The semiconductor device according to claim 2, wherein
the further contact pad is an external lead, and wherein a lower surface of the external lead and a lower surface of the die pad are attached to a same leadframe.

9. The semiconductor device according to claim 1, further comprising
a second semiconductor die comprising a first surface and a second surface opposite to the first surface; wherein
the further contact pad is a contact pad disposed on the second surface of the second semiconductor die.

10. The semiconductor device according to claim 9, wherein the first layer comprises an opening disposed above the further contact pad, wherein the second layer extends into the opening in order to make contact with the further contact pad.

11. The semiconductor device according to claim 2, further comprising
a second die pad, wherein
the second semiconductor die is attached with the second surface to the second die pad.

12. A semiconductor device, comprising
a semiconductor die comprising a first surface, a second surface opposite to the first surface, and a contact pad disposed on the first surface;
a clip comprising a first layer of a first metallic material and a second layer of a second material different from the first metallic material; wherein
the first layer of the clip is connected with the contact pad, and the second layer of the clip is exposed to the outside.

13. The semiconductor device according to claim 12, further comprising
a die pad; wherein
the semiconductor die is attached with its second surface to the die pad.

14. The semiconductor device according to claim 12, further comprising
an external lead, wherein
the first layer of the clip is connected with the external lead.

15. The semiconductor device according to claim 12, wherein
one of the first and second materials is Cu and the other one is Al.

16. The semiconductor device according to claim 12, wherein
the second material is a non-conductive material.

17. A process for connecting a clip to two different contact pads, the process comprising:
providing a clip comprising a first metallic layer of a first metallic material and a second metallic layer of a second metallic material different from the first metallic material;
connecting the first metallic layer to a first contact pad by a first connecting process; and
connecting the second metallic layer to a second contact pad by a second connecting process.

18. The process according claim 17, wherein
the second connecting process is the same as the first connecting process.

19. The process according claim 18, wherein
the first and second connecting processes both comprise ultrasonic welding.

20. The process according claim 17, wherein
the second connecting process is different from the first connecting process.

* * * * *